United States Patent [19]

Masuko et al.

[11] Patent Number: 4,613,826
[45] Date of Patent: Sep. 23, 1986

[54] FREQUENCY SYNTHESIZER FOR CATV TUNER

[75] Inventors: Akinori Masuko, Kawasaki; Wataru Kuroiwa, Fukaya; Yasufumi Shimizu, Fukaya; Hideki Hirosawa, Fukaya, all of Japan

[73] Assignee: Kabushiki Kaisha Toshiba, Kawasaki, Japan

[21] Appl. No.: 729,986

[22] Filed: May 3, 1985

[51] Int. Cl.[4] .......................... H03L 7/06; H04K 1/02
[52] U.S. Cl. ...................................... 331/14; 331/17; 358/114
[58] Field of Search ........................ 331/1 A, 2, 14, 17; 375/97, 120; 358/114, 191.1, 195.1, 118

[56] References Cited

U.S. PATENT DOCUMENTS 4,280,140  7/1981  Skerlos ............................ 358/195.1
4,360,832  11/1982  Rzeszewski ...................... 358/191.1
4,453,136  6/1984  Kelland .............................. 331/1 A

FOREIGN PATENT DOCUMENTS 2057816  4/1981  United Kingdom ................. 375/97

Primary Examiner—Eugene R. LaRoche
Assistant Examiner—D. C. Mis
Attorney, Agent, or Firm—Finnegan, Henderson, Farabow, Garrett & Dunner

[57] ABSTRACT

A variable frequency oscillator includes a RAM which stores a frequency setting data and provides a frequency control data, a VCO circuit which provides an oscillation output having a frequency which is defined by the contents of the frequency control data, a reference oscillator which provides a reference signal having a given frequency and phase, a phase comparator which detects the phase difference between the reference signal and a comparison signal corresponding to the oscillation output, and a logic circuit which combines the frequency control data with a phase data and provides the frequency setting data. The phase comparator provides the phase data whose contents indicate +1 if the phase of the comparison signal is delayed from the phase of the reference signal, indicate −1 if the phase of the comparison signal is advanced to the phase of the reference signal, and indicate 0 if the phase of the comparison signal matches with the phase of the reference signal.

9 Claims, 14 Drawing Figures

FREQUENCY SYNTHESIZER FOR CATV TUNER

BACKGROUND OF THE INVENTION

The present invention relates to a variable frequency oscillator in general, and in particular to a variable frequency oscillator for jamming or interfering with specific TV signals of a cable TV (CATV) system.

Conventionally a phase-locked loop is adapted to a variable frequency oscillator. As is well known, the circuit of a phase-locked loop is provided with a voltage controlled oscillator (VCO), a programmable frequency divider for dividing the output frequency of the VCO, a phase comparator for detecting the frequency and phase differences between the output of the programmable frequency divider and that of a reference oscillator, and a filter circuit for converting the output from the phase comparator to a ripple-free dc voltage and supplying the converted dc voltage to a frequency control terminal of the VCO. When the frequency of this VCO is made variable, means for switching the frequency dividing ratio of the programmable frequency divider is further provided.

With this kind of a conventional variable frequency oscillator, however, the period from the time when the dividing ratio is switched so as to set a new target frequency to the time when the output frequency is stabilized at the new target frequency becomes long. Thus, according to the conventional variable frequency oscillator, the response speed of frequency switching, which is defined by the time period between the setting of the dividing ratio and the stabilization of the output frequency, can not be made high enough. This causes difficulty in obtaining various kinds of frequencies within a certain limited time period (which is frequently several tens of microseconds at most).

SUMMARY OF THE INVENTION

It is accordingly an object of the present invention to provide a variable frequency oscillator having high frequency switching response speed.

Another object of the invention is to provide a variable frequency oscillator which is suitable for interfering with specific TV signals of a CATV system.

To achieve the above object, in a variable frequency oscillator of the invention, data (E17) sequentially read-out from a RAM (17) is used for setting the frequency of a VCO (11) so that the VCO frequency is rapidly switched or changed in a short time. This read-out data (E17) is converted via a digital/analog (D/A) converter (19) into an analog control voltage (VT) for controlling the frequency of the VCO (11).

According to the variable frequency oscillator of this invention, it is possible to enhance the switching response speed of the VCO frequency. This is because the D/A converter (19) can generate the VCO control voltage (VT) without relying upon a filter circuit which would deteriorate the switching response speed.

Further, the VCO frequency can be kept stable by intermittent monitoring of the signal phase of the VCO output to obtain phase error data (E14) which is fed back to the D/A converter (19).

DETAILED DESCRIPTION OF THE PREFERRED EMBODIMENTS

Figure 1:
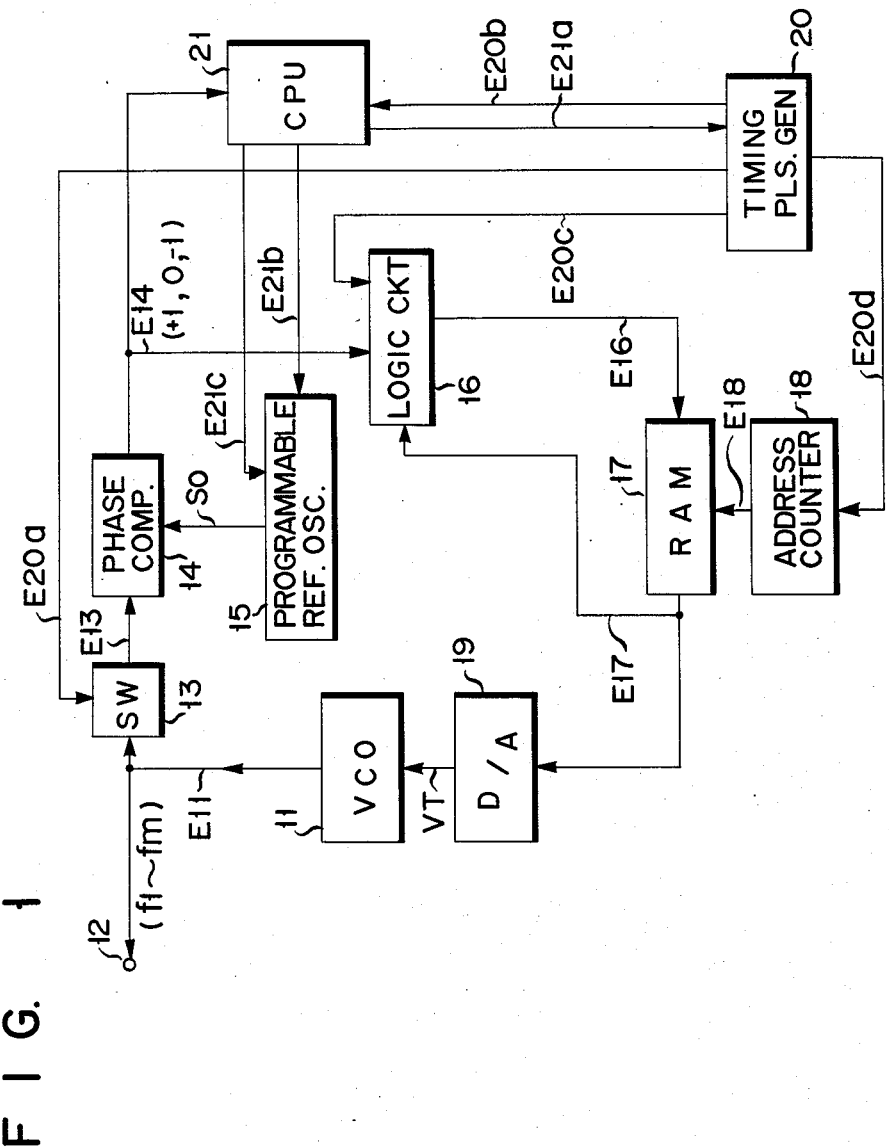
FIG. 1 shows a block diagram of a variable frequency oscillator according to an embodiment of the present invention.

Hereinafter, preferred embodiments of the invention will be described in detail with reference to the accompanying drawings. In the following, similar elements are denoted by similar reference numerals throughout the drawings for simplifying the explanation.

FIG. 1 shows a block diagram of a variable frequency oscillator of this invention. In FIG. 1, the reference numeral 11 denotes a VCO. An oscillation output E11 from VCO 11 is supplied to an output terminal 12 of the variable frequency oscillator. Also, output E11 is supplied to a switch circuit 13. Circuit 13 may be formed with a analog gate which is conductive (or circuit 13 is turned-on) only if a timing pulse E20a is generated from a timing pulse generator 20. Circuit 13 is nonconductive (or turned-off) when pulse E20a disappears. The generation timing of pulse E20a is determined by timing data E21a supplied from a microcomputer (CPU) 21 to generator 20.

When pulse E20a is generated, circuit 13 supplies to a signal input terminal of a phase comparator 14 an output E13 corresponding to a specific signal component of E11. A reference signal input terminal of comparator 14 receives from a programmable reference oscillator 15 a frequency reference signal So. Signal So is obtained by dividing the frequency of a clock signal E21b by a given frequency dividing data E21c. E21b and E21c are delivered from CPU 21. The target of the frequency and phase of output E13 is defined by signal So.

Comparator 14 compares the frequency and phase differences between E13 and So. As the result of the comparison, comparator 14 generates a digital phase data E14 of either +x, 0 or −y. Data x and y are optional numerical numbers. In many cases, each of x and y may be "1". The +x (or +1) data of E14 indicates that the phase of E13 is delayed from the phase of So. The 0 data indicates that the phases of E13 and So match, and the −y (or −1) data indicates that the E13 phase is advanced to the So phase. If the phases of E13 and So match, comparator 14 supplies data E14 of 0 to CPU 21. When E14=0 is supplied, CPU 21 changes the frequency dividing data E21c so that the frequency of signal So is changed. At the same time, CPU 21 changes timing data E21a so that the generation timing of pulse E20a corresponds to the frequency change of signal So.

Phase data E14 from comparator 14 is supplied to a logic circuit 16. Circuit 16 receives read out data E17 from a RAM 17 and a timing pulse E20c delivered from generator 20. When pulse E20c is received and data E14 indicates "−1", circuit 16 decrements the contents of data E17 by "1". Then, decremented data E16 (=E17−1) from circuit 16 is rewritten in the corresponding address of RAM 17. When E14 indicates "+1" and E20c is received, circuit 16 increments E17 by "1" and sends the incremented data E16 (=E17+1) to the corresponding address of RAM 17. When E14 indicates "0" and E20c is received, the contents of E17 are not changed and circuit 16 returns the unchanged data E16 (=E17) to the corresponding address of RAM 17.

Data E17 from RAM 17 is supplied to the digital input terminal of a D/A converter 19. Converter 19 converts the digital information of data E17 into an analog dc control voltage VT. Voltage VT from converter 19 is applied to the frequency control terminal of VCO 11 and serves to control the frequency of VCO 11.

Figure 2:
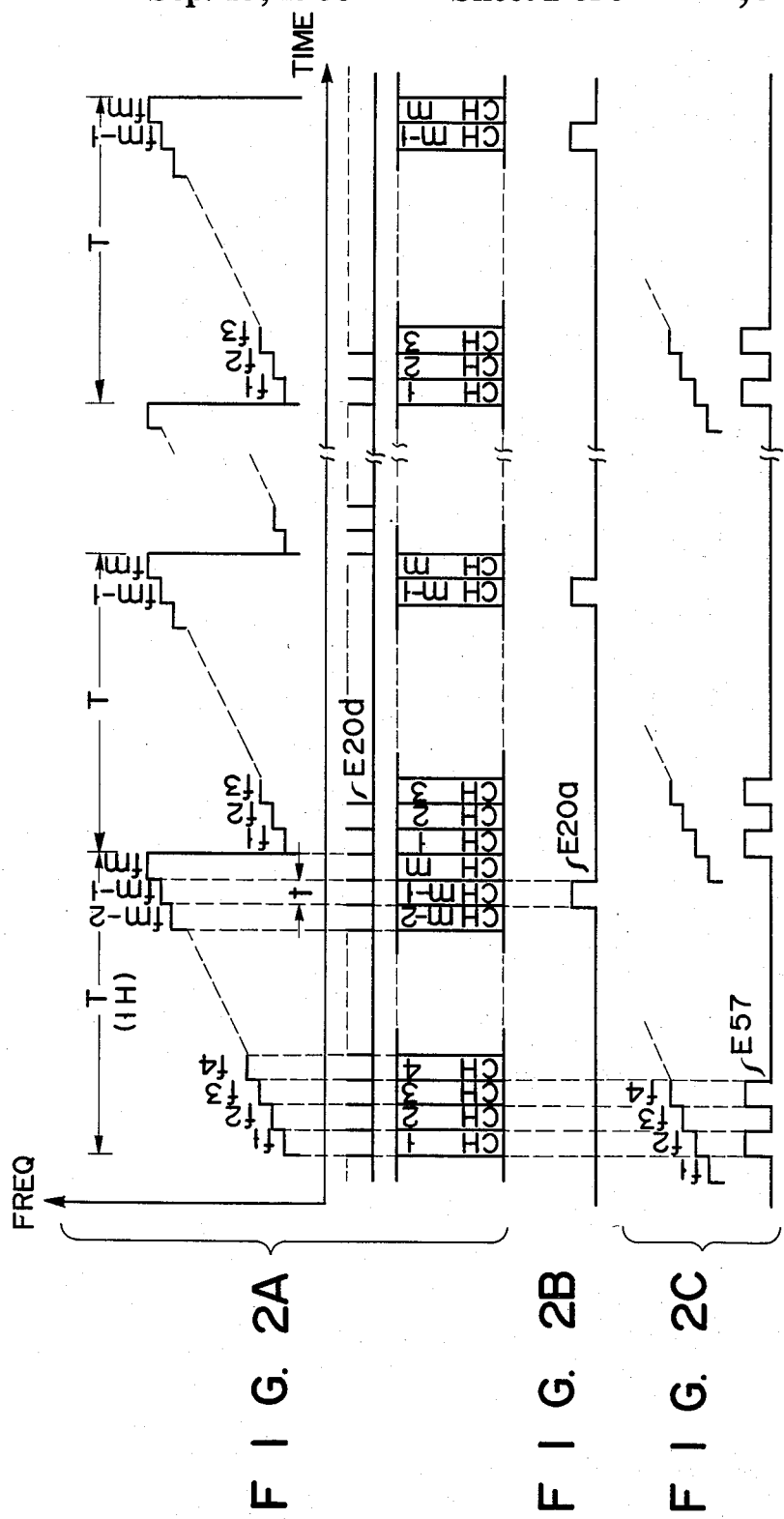
FIG. 2A is a graph showing how the VCO frequency is switched or changed with the passage of time, and showing the relation between the VCO frequencies (fl to fm) and the contents (channel 1 to channel m) of a CATV signal.
FIG. 2B shows a timing pulse (E20a) which turns on the switch circuit (13) of FIG. 1 at the time when the VCO frequency corresponds to the channel m−1 of the CATV signal.
FIG. 2C shows a timing pulse (E57) which turns on the switch circuit (29) in FIG. 3 at the time when the VCO frequency corresponds to the channels 1 and 3 of the CATV signal.

RAM 17 stores predetermined potential data E17 which contains information of a staircase-like potential distribution as shown in FIG. 2A. Potentials of data E17 respectively correspond to oscillation frequencies $f_1$ to $f_m$ of VCO 11, and frequencies $f_1$ to $f_m$ are assigned to channels 1 to m. The read out address of RAM 17 is specified by address data E18 from an address counter 18. The contents of data E18 is switched or changed by the clocking of a timing pulse E20d form generator 20. The clocking period of pulse E20d is indicated by t in FIG. 2A. The address of RAM 17 is sequentially switched for every time t, and the sequential address switching of RAM 17 is repeated for each given cycle T (FIG. 2A).

Thus, control voltage VT applied to VCO 11 is switched every time t, and the output frequency ($f_1$, $f_2$, $f_3$, ..., $f_m$) of VCO 11 as well is switched each time t. This frequency switching is repeated for the period (T) of, e.g., one horizontal scanning (1H) of a TV signal.

According to the above embodiment, since direct memory access is effected to obtain the VCO control voltage (VT) without a filter circuit, the switching speed (changing rate) of control voltage VT can be sufficiently enhanced. From this, the frequency switching response speed becomes high enough and, therefore, oscillation output E11 having various frequencies ($f_1$ to $f_m$) can be surely obtained from VCO 11 within the short time period T.

Meanwhile, according to a conventional variable frequency oscillator, when a CATV unit employing such a variable frequency oscillator is installed in an outdoor location, a phase drift in the VCO output often occurs due to changes in the ambient temperature and due to the passage of time. On the contrary, according to the above-mentioned embodiment of the invention, such a phase drift can be removed. This is because the closed circuit of the elements 11, 13, 14, 16, 17 and 19 constitutes an automatic frequency control (AFC) loop which serves to stabilize the frequency of output E11. In the following, how such a phase drift is removed will be described.

Suppose a case wherein the phase drift of the generated frequency $f_{m-1}$ is to be removed. Then, switch circuit 13 is turned on by timing pulse E20a (FIG. 2B) generated when the frequency of output E11 is $f_{m-1}$. In this case, programmable reference oscillator 15 is providing reference signal So of frequency $f_{m-1}$.

Output E13 from circuit 13 and signal So from oscillator 15 are compared in phase comparator 14. According to the result of frequency and phase comparison, comparator 14 generates data E14 of either +1, −1 or 0. Namely, if the E13 phase of $f_{m-1}$ is advanced to the So phase, data E14 of −1 is generated. If the E13 phase is delayed from the So phase, data E14 of +1 is generated. In response to such data E14, logic circuit 16 modifies the contents of data E17 currently being read out from RAM 17, and the modified data E16 from circuit 16 is rewritten into the corresponding address of RAM 17. If the phases of E13 and So match, data E14 of 0 is generated, i.e., no data modification is effected.

By repeating a number of times the above data modifying operation, the frequency and phase of output E13 (=E11 of $f_{m-1}$) are matched with those of signal So of $f_{m-1}$. In other words, by progressively adding or subtracting data 1 to or from data E17 which represents frequency $f_{m-1}$, fine adjustments to the control voltage VT for obtaining frequency $f_{m-1}$ with a prescribed phase are performed.

The phase adjustment of frequencies other than $f_{m-1}$ is performed in a similar fashion. For instance, when the phase of frequency $f_m$ is to be adjusted, the generation timing of pulse E20a is changed so that switch circuit 13 is turned on during the period of $f_m$, while the frequency of signal So from oscillator 15 is set at $f_m$ according to other dividing data E21c from CPU 21. Thereafter, the operation of phase comparison between E13 and So (=$f_m$) is repeated until data E14 of 0 is obtained from comparator 14.

Incidentally, when data E14 of 0 is supplied to CPU 21, pulse generator 20 may stop the supply of pulse E20a so that switch 13 is open-circuited (turned off) during E14=0 is obtained. In this case, so long as E14=0 is retained, said AFC loop is disabled.

Figure 3:
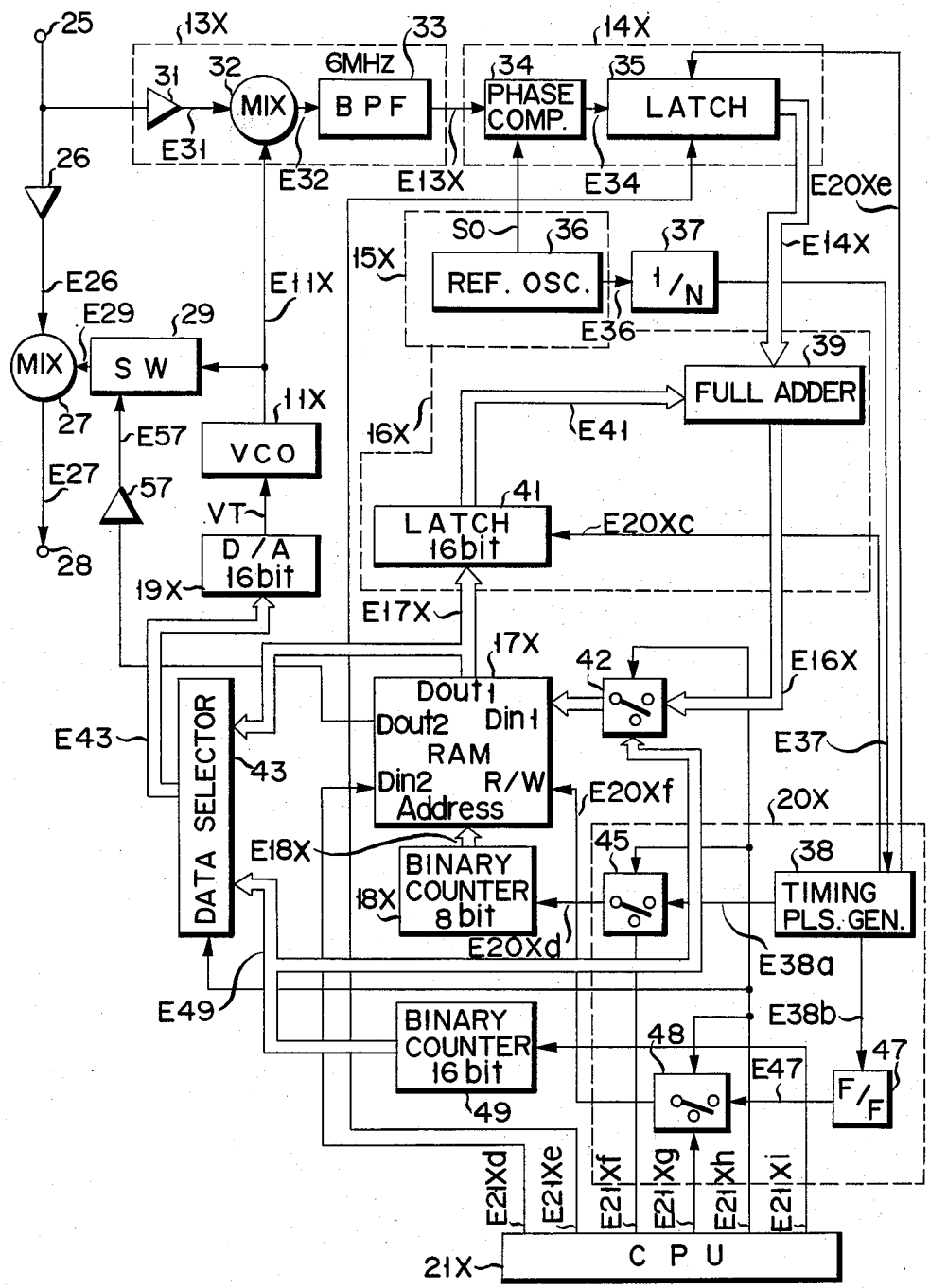
FIG. 3 shows a block diagram of a variable frequency oscillator for interfering with specific channels of the CATV signal, which is another embodiment of the invention.

FIG. 3 shows a block diagram of a variable frequency oscillator for jamming or interfering with specific CATV channels, which is another embodiment of the invention.

In FIG. 3, the reference numeral 25 denotes an input terminal of the variable frequency CATV jamming (or interfering) oscillator. Input terminal 25 is coupled via a signal cable to a CATV station (not shown). Input terminal 25 receives a multichannel CATV signal. The CATV signal contains TV information of, e.g., 60 channels. (In this case, m in FIG. 2A is 60.) A carrier frequency difference of, e.g., 6 MHz is assigned between respective two adjacent channels in these 60 channels. That is, the frequency difference $f_{i+1} - f_i$ (i=1, 2, 3, ..., 60) of respective adjacent channels is always 6 MHz. The CATV signal is input to a buffer amplifier 26. An output signal E26 from amplifier 26 is supplied to a mixer 27. Mixer 27 mixes a jamming (or interference) signal E29 with signal E26 and supplies a mixed output E27 to an output terminal 28. Output terminal 28 is coupled to the CATV converter or CATV tuner (not shown) of a subscriber(s).

Jamming signal E29 jams or interferes with specific channels in the CATV signal, channels for which the subscriber has not contracted. Although such a jamming signal can be obtained from VCO 11 of FIG. 1, jamming signal E29 of FIG. 3 is obtained from a VCO 11X being associated with a circuit which is somewhat different from the corresponding circuit in FIG. 1.

In the following, descriptions will be given to a circuit configuration for obtaining jamming signal E29.

The CATV signal from terminal 25 is input to a limiter amplifier 31. An output E31 from amplifier 31 is supplied to a mixer 32. Mixer 32 receives an oscillation output E11X from VCO 11X. The frequency of E11X is always lower (or higher) by 6 MHz than that of E31. That is, when the frequencies of 60 channels in the CATV signal are respectively denoted by $f_1$ to $f_{60}$, the frequency of E11X from VCO 11X is sequentially changed from $f_1-6$ MHz to $f_{60}-6$ MHz (or from $f_1+6$ MHz to $f_{60}+6$ MHz). From this, an output E32 from mixer 32 always contains the frequency component of 6 MHz. This 6 MHz component is extracted by a bandpass filter (BPF) 33. An extracted signal E13X from BPF 33 is supplied to a phase comparator 34.

Elements 31 to 33 form a heterodyne circuit 13X which corresponds to switch circuit 13 in FIG. 1. Signal E13X from BPF 33 and output E11X from VCO 11X are not equal to E13 and E20a in FIG. 1, respectively, but are corresponding to E13 and E20a. Namely, the contents (channel numbers) of E13 in FIG. 1 are determined by the generation timing of E20a, while the contents (channel numbers) of E13X in FIG. 3 are determined by the frequency of E11X.

Comparator 34 receives a frequency reference signal So from a reference frequency oscillator 36. Since the frequency of E13X is fixed at 6 MHz, the frequency of So is also fixed at 6 MHz. Oscillator 36 further generates a clock signal E36 having the same frequency as So. The frequency of signal E36 is divided by a prescribed number N by a frequency divider (or a modulo N counter) 37. A frequency-divided output E37 from divider 37 is used for the master clock of a timing pulse generator 38.

Element 36 forms a reference oscillator circuit 15X corresponding to reference oscillator 15 in FIG. 1.

Comparator 34 compares the difference of the frequency and phase between E13X and So. As the result of the comparison, comparator 34 generates a digital phase data E34 of either +1, 0 or −1. The +1 data of E34 indicates that the phase of output E13X is delayed from the phase of signal So. The 0 data of E34 indicates that the phases of E13X and So match, and the −1 data of E34 indicates that the E13X phase is advanced to the So phase. Phase data E34 from comparator 34 is supplied to a latch 35. At the initial stage of operation, the contents of latch 35 have been cleared by a clear pulse E21Xe from a CPU 21X. When a latch pulse E20Xe is supplied from timing pulse generator 38, latch 35 stores phase data E34 from comparator 34.

Elements 34 and 35 form a phase comparator circuit 14X corresponding to phase comparator 14 in FIG. 1.

Data E14X delivered from latch 35 is supplied to a full adder 39. Adder 39 receives data E41 delivered from a latch 41 and outputs added data E16X. Added data E16X is supplied via a switch 42 to a first data input terminal Din1 of RAM 17X. The contents of data E41 are identical with those of data E17X which is read out from a first data output terminal Dout1 of RAM 17X and is stored in latch 41 by a latch pulse E20Xc. Pulse E20Xc is generated from timing pulse generator 38 in synchronism with the generation of pulse E20Xe.

Elements 39 and 41 form a logic circuit 16X corresponding to logic circuit 16 in FIG. 1.

Timing pulse generator 38 generates timing pulses E38a and E38b. The frequency of E38a is the same as that of E38b. Pulse E38a is supplied as a clock pulse E20Xd to the clock input terminal of an address counter 18X via a switch 45. The read or write address of RAM 17X is designated by address data E18X from counter 18X. Pulse E38b is frequency-divided by 2 by a flip-flop 47. A frequency-divided pulse E47 from flip-flop 47 is supplied as a mode signal E20Xf to the read/write mode designation terminal of RAM 17X via a switch 48. The mode of read/write of RAM 17X is designated by the logic level of mode signal E20Xf.

Elements 38, 45, 47 and 48 form a timing pulse generator circuit 20X corresponding to timing pulse generator 20 in FIG. 1.

CPU 21X supplies a clock signal E21Xi to a binary counter 49. Counter 49 provides count data E49 to switch 42. CPU 21X also supplies clock signals E21Xf and E21Xg to switches 45 and 48, respectively. The selection state of switches 42, 45 and 48 is determined by a selection signal E21Xh generated from CPU 21X. When switches 42, 45 and 48 select E49, E21Xf and E21Xg according to selection signal E21Xh, respectively, and if signal E20Xf (=E21Xg) designates the write mode, the contents of counter 49 are stored in RAM 17X. In this case, the write address of RAM 17X is determined according to the clocking of E21Xf.

Read out data E17X from RAM 17X and counted data E49 from counter 49 are input to a data selector 43. The data selection state of selector 43 is determined by the logic level of selection signal E21Xh from CPU 21X. When the logic levels of signals E21Xg and E21Xh indicate that data E49 is to be written in RAM 17X, selector 43 selects data E49 and supplies selected data E43 (=E49) to the digital input terminal of a D/A converter 19X. Converter 19X converts the supplied data E43 into a corresponding dc control voltage VT. Voltage VT is used for controlling the frequency and phase of output E11X of VCO 11X.

Output E11X from VCO 11X is input to a switch circuit 29 which may be formed with an analog gate. Circuit 29 is turned on according to a switch signal E57. During the turned on period of circuit 29, circuit 29 supplies jamming signal E29 to mixer 27. Signal E57 is obtained via a buffer 57 from a second data output terminal Dout2 of RAM 17X. The contents and generation timing of signal E57 from RAM 17X are determined by data E21Xd. Data E21Xd is supplied from CPU 21X to a second data input terminal Din2 of RAM 17X. The read out address for obtaining signal E57 is determined by address data E18X.

Data E49 from counter 49 may be utilized at the time of an initial stage of circuit operation wherein the actual result of the phase comparison has not yet been obtained from phase comparator 34. After the actual phase comparison result has been once obtained, selector 43 selects data E17X from RAM 17X, and switches 42, 45 and 48 respectively select data E16X from adder 39, pulse E38a from generator 38 and pulse E47 from flip-flop 47.

Incidentally, signals E21Xd to E21Xi from CPU 21X (or data E49 from counter 49) may be directly obtained from a proper manipulation of a keyboard (not shown) by a system operator.

Assume that the subscriber using the CATV signal transmitted from terminal 28 has not contracted with the CATV company for channels 1 and 3, and the frequencies of channels 1 to 60 are respectively higher by 6 MHz than the phase-adjusted frequencies $f_1$ to $f_{60}$ of VCO output E11X. For instance, when the frequencies of channels 1, 2, 3 and 4 are 100 MHz, 106 MHz, 112

MHz and 118 MHz, respectively, the frequencies of $f_1$, $f_2$, $f_3$ and $f_4$ of E11X are 94 MHz, 100 MHz, 106 MHz and 112 MHz, respectively. In this case, jamming signal E29 contains the frequencies of $f_2 = 100$ MHz (for interfering with channel 1) and $f_4 = 112$ MHz (for interfering with channel 3). Such a signal E29 is generated at the time of signal transmission of channels 1 and 3. The generation timing of signal E29 is determined by switch signal E57 (FIG. 2C). The contents and generation timing of signal E57 are determined by data E21Xd in accordance with which channel(s) is not contracted for by the subscriber.

FIGS. 4A to 4H are timing charts showing typical signals appearing in the circuit of FIG. 3. FIG. 5 is a flow chart showing the operation sequence of one cycle (T) of the FIG. 3 circuit.

After completion of initializing by counter 49, the circuit of FIG. 3 will operate as follows.

First, the contents of address counter 18X are changed to "1" by pulse E20Xd (t10 in FIGS. 4C and 4D) so that address data E18X designates the first address of RAM 17X (ST 10 in FIG. 5). Then, data E17X nominally representing frequency $f_1$ is read out from RAM 17X (ST 12; after t10 in FIG. 4B). VCO 11X oscillates according to this data E17X so that the frequency of oscillation output E11X becomes roughly $f_1$ (ST 14; after t10 in FIG. 4A). The frequency of E11X is changed via heterodyne circuit 13X to nominally 6 MHz signal E13X. This 6 MHz signal E13X is phase-compared in comparator 34 with an accurate 6 MHz frequency reference signal So (ST 16).

After completion of the phase comparison, latch pulses E20Xc and E20Xe are generated (t12 in FIG. 4E) so that phase data E34 from comparator 34 and the presently obtained read out data E17X from RAM 17X are stored in latches 35 and 41, respectively. Then, the contents of latch 41 are changed to nominal $f_1$ data (after t12 in FIG. 4G) and, if the phase of E13X is delayed from the phase of So (YES at ST 18), data E34 of $+1$ is stored in latch 35 (after t12 in FIG. 4F). In this case, adder 39 provides data E16X corresponding to E17X+1 (ST 20). This data (E17X+1) is rewritten into the first address of RAM 17X (ST 28; t14 in FIG. 4B), and the contents of RAM 17X at the corresponding address (first address) are changed from data $f_1$ to new data $f_1^*$ (after t14 in FIG. 4H).

If the E13X phase is not delayed from the So phase (NO at ST 18) but it is advanced to the So phase (YES at ST 22), data E34 of $-1$ is stored in latch 35 and adder 39 provides data E16X corresponding to E17X−1 (ST 24). This data (E17X −1) is rewritten into the first address of RAM 17X (ST 28), and the contents of RAM 17X at the first address are changed from data $f_1$ to new data $f_1^*$. If the E13X phase matches with the So phase (NO at ST 18 and NO at ST 22), data E34 of 0 is stored in latch 35 and adder 39 provides data E16X being equal to E17X (ST 26). This data (E17X) is rewritten into the first address of RAM 17X (ST 28), and the contents of RAM 17X at the first address are not changed.

Figure 4:
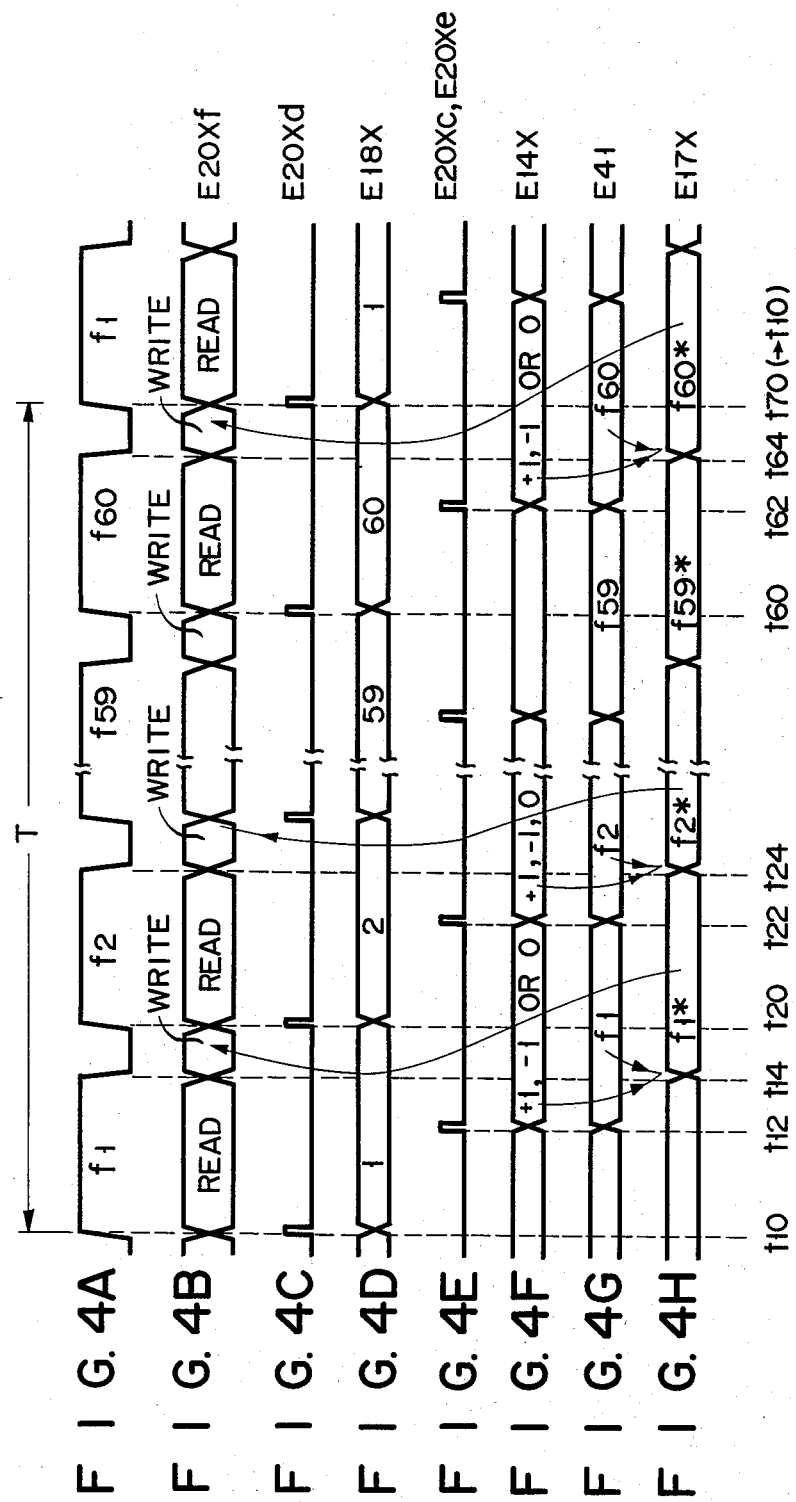
FIGS. 4A to 4H are timing charts showing typical signals appearing in the embodiment of FIG. 3 and explaining the circuit operation with respect to the RAM (17X) in the FIG. 3 embodiment.
Figure 5:
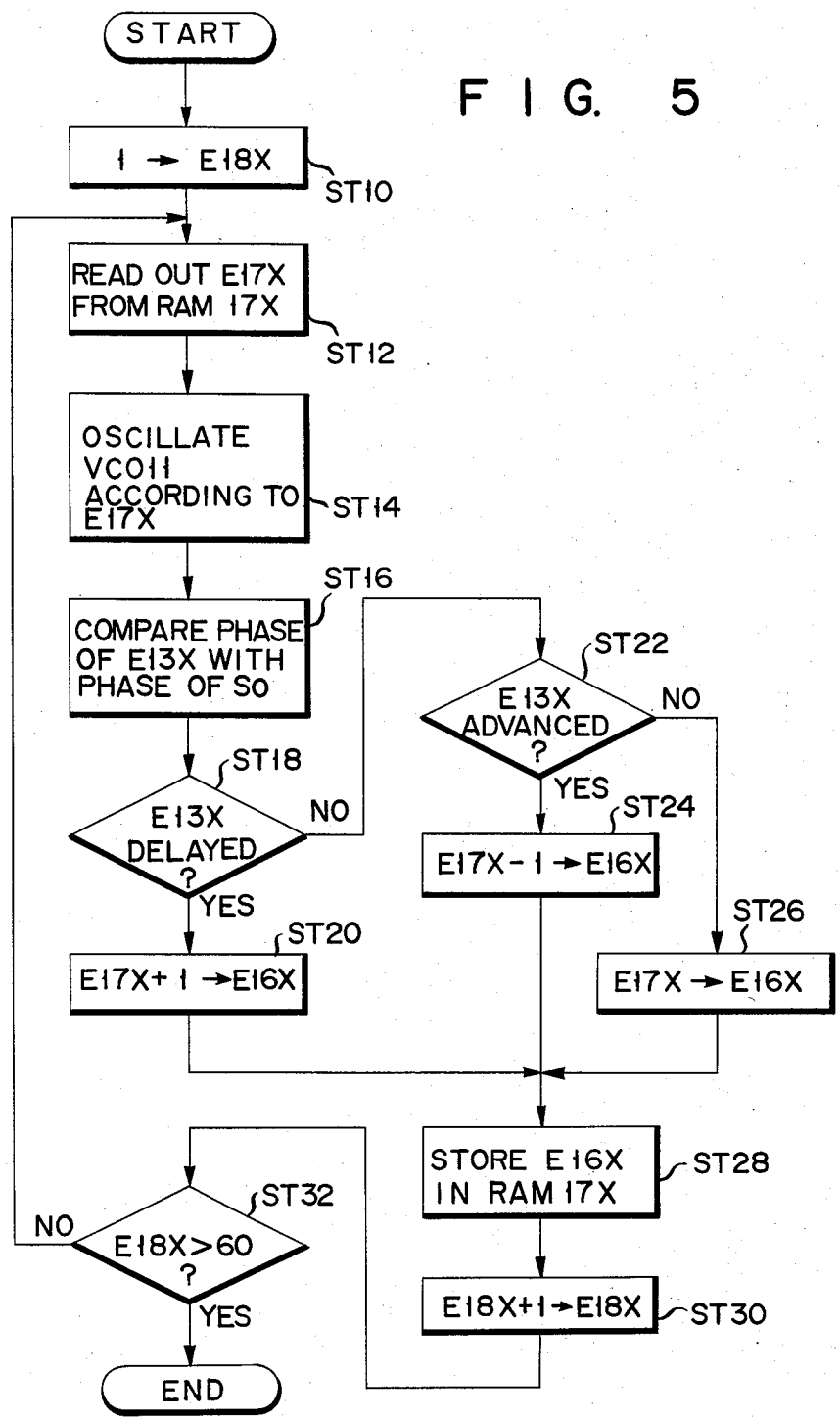
FIG. 5 is a flow chart showing a typical operation sequence of one cycle (T) of the circuit in FIG. 3.

After renewal of (or retaining of) data E17X, the contents of counter 18X are incremented by "1" by the clocking of pulse E20Xd (ST 30; t20 in FIG. 4C). Then, counter 18X designates the second address of RAM 17X, i.e., E18X=2 (NO at ST 32), and the data renewal of E17X for frequency $f_2$ is similarly performed (ST 12 to ST 32; from t20 to t24 in FIGS. 4A to 4H). Such data renewal operation is repeated until E18X>60 is detected. When the data renewal of 60th address of RAM 17X for frequency $f_{60}$ is finished, counter 18X is further incremented by "1" by pulse E20Xd (t70 in FIG. 4C). Then, the operation for one cycle T is ended, and the contents of counter 18X are reset to "1" (after t70 in FIG. 4D).

The above operation is repeated for a number of cycles so that the phase comparison result of E14X=0 is obtained for each of frequencies $f_1$ to $f_{60}$.

After obtaining correct frequencies $f_1$ to $f_{60}$ according to the above-mentioned operation, switch circuit 29 is turned on by switch signal E59 when data E17X indicates the frequencies $f_2$ (100 MHz) and $f_4$ (112 MHz). Then, channel 1 (100 MHz) and channel 3 (112 MHz) in the CATV signal delivered from output terminal 28 are jammed or interfered by signal E29 containing the jamming signal components of frequencies $f_2$ (100 MHz) and $f_4$ (112 MHz).

As will be understood from the above description, according to the variable frequency oscillator of the present invention, since no filter circuit is associated with the circuit path of control voltage VT of the VCO, a high frequency switching response speed can be obtained. In addition, since the phase comparison is effected so long as a phase difference between the VCO output (E13, E13X) and the reference signal (So) exists, the VCO frequency can be stably maintained.

While the invention has been described in connection with what is presently considered to be the most practical and preferred embodiment, it is understood that the invention is not to be limited to the disclosed embodiment but, on the contrary, is intended to cover various modifications and equivalent arrangements included within the scope of the appended claims which scope is to be accorded the broadest interpretation so as to encompass all such modifications and equivalent structures.

What is claimed is:

1. A variable frequency oscillator comprising:

memory means for storing a frequncy setting data and providing a frequency control data;

voltage controlled oscillator means coupled to said memory means for providing an oscillation output whose frequency is defined by the contents of said frequency control data;

reference signal means for providing a reference signal having a given frequency and phase;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data; and signal selection means coupled to said voltage controlled oscillator means and to said phase comparator means for selecting a specific frequency component of said oscillation output to provide said comparison signal, said signal selection means including heterodyne means being responsive to an input signal for providing said comparison signal whose frequency is equal to the frequency difference between said input signal and said oscillation output.

2. A variable frequency oscillator according to claim 1, further comprising:

extractor means coupled to said voltage controlled oscillator means, for extracting a specific frequency component from said oscillation output and providing an interference signal having said specific frequency component; and mixer means coupled to said extractor means and being responsive to said input signal, for mixing said interference signal with said input signal to provide an output signal which contains information of said input signal except for information of the frequency of said interference signal.

3. A variable frequency oscillator comprising:

memory means for storing a frequency setting data and providing a frequency control data;

voltage controlled oscillator means coupled to said memory means for providing an oscillation output whose frequency is defined by the contents of said frequency control data;

reference signal means for providing a reference signal having a given frequency and phase;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data;

circuit means coupled to said memory means for sequentially selecting said frequency setting data and sequentially providing said frequency control data during a given period of time; and signal selection means coupled to said voltage controlled oscillator means and to said phase comparator means for selecting a specific frequency component of said oscillation output to provide said comparison signal, said signal selection means including heterodyne means being responsive to an input signal for providing said comparison signal whose frequency is equal to the frequency difference between said input signal and said oscillation L output.

4. A variable frequency oscillator according to claim 3, further comprising:

extractor means coupled to said voltage controlled oscillator means, for extracting a specific frequency component from said oscillation output and providing an interference signal having said specific frequency component; and mixer means coupled to said extractor means and being responsive to said input signal, for mixing said interference signal with said input signal to provide an output signal which contains information of said input signal except for information of the frequency of said interference signal.

5. A variable frequency oscillator comprising:

memory means for storing a frequency setting data and providing a frequency control data;

voltage controlled oscillator means coupled to said memory means for providing an oscillation output whose frequency is defined by the contents of said frequency control data;

reference signal means for providing a reference signal having a given frequency and phase;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data;

extractor means coupled to said voltage controlled oscillator means for extracting a specific frequency component from said oscillation output and providing an interference signal having said specific frequency component; and mixer means coupled to said extractor means and being responsive to an input signal for mixing said interference signal with said input signal to provide an output signal which contains information of said input signal except for information of the freqency of said interference signal.

6. A variable frequency oscillator comprising:

memroy means for storing a frequency setting data and providing a frequency control data;

voltage controlled oscillator means coupled to said memory means for providing an oscillation output whose frequency is defined by the contents of said frequency control data;

reference signal means for providing a reference signal having a given frequency and phase;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data;

signal selection means coupled to said voltage controlled oscillator means and to said phase comparator means for selecting a specific frequency component of said oscillation output to provide said comparison signal;

extractor means coupled to said voltage controlled oscillator means for extracting a specific frequency component from said oscillation outut and providing an interference signal having said specific frequency component; and mixer means coupled to said extractor means and being responsive to an input signal for mixing said interference signal with said input signal to provide an output signal which contains information of said input signal except for information of the frequency of said interference signal.

7. A variable frequency oscillator comprising:

memory means for storing a frequency setting data and providing a frequency control data, said memory means including a read/write memory into which a plurality of said frequency setting data are written at given individual addresses from which a plurality of said frequency control data are read-out;

circuit means coupled to said memory means for sequentially selecting said frequency setting data and sequentially providing said freqency control data during a given period of time, said circuit means including an address counter coupled to said read/write memory for designating the read address of said read/write memory when said plural frequency control data read-out and designating the write address of said read/write memory when said plural frequency setting data are written, and change means coupled to said address counter for sequentially changing during said given period of time the address designation of said address counter so that said plural frequency control data are sequentially read-out from said read/write memory and said plural frequency setting data are sequentially written in said read/write memory, said sequential changing of the address designation being repeated;

voltage controlled oscillator means coupled to said memory means for providing an oscillation output whose frequency is defined by the contents of said frequency control data;

reference signal means for providing a reference signal having a given frequency and phase, said reference signal means including a variable frequency oscillator for generating said reference signal, the contents of said reference signal being sequentially changed by said change means so that the frequency of said reference signal substantially corresponds to that of said oscillation output;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data;

extractor means coupled to said voltage controlled oscillator means for extracting a specific frequency component from said oscillation output and providing an interference signal having said specific frequency component; and mixer means coupled to said extractor means and being responsive to said input signal for mixing said interference signal with said input signal to provide an output signal which contains information of said input signal except for information of the frequency of said interference signal.

8. A variable frequency oscillator comprising:

memory means for storing a frequency setting data and providing a frequency control data, said memory means including a read/write memory into which a plurality of said frequency setting data are written at given individual addresses from which a plurality of said frequency control data are read-out;

circuit means coupled to said memory means for sequentially selecting said frequency setting data and sequentially providing said frequency control data during a given period of time, said circuit means including an address counter coupled to said read/write memory for designating the read address of said read/write memory when said plural frequency control data read-out and designating the write address of said read/write memory when said plural frequency setting data are written, and change means coupled to said address counter for sequentially changing during said given period of time the address designation of said address counter so that said plural frequency control data are sequentially read-out from said read/write memory and said plural frequency setting data are sequentially written in said read/write memory, said sequential changing of the address designation being repeated;

voltage controlled oscillator means coupled to said memory means for providing an oscillation output whose frequency is defined by the contents of said frequency control data;

reference signal means for providing a reference signal having a given frequency and phase;

phase comparator means coupled to said voltage controlled oscillator means and to said reference signal means for detecting the phase difference between said reference signal and a comparison signal corresponding to said oscillation output and for providing a phase data whose contents indicate a first value if the phase of said comparison signal is delayed from the phase of said reference signal, indicate a second value if the phase of said comparison signal is advanced to the phase of said reference signal, and indicate a third value if the phase of said comparison signal matches with the phase of said reference signal;

logic means coupled to said phase comparator means and to said memory means for correcting said frequency control data according to said phase data and for replacing said frequency setting data with the corrected frequency control data; and signal selection means coupled to said voltage controlled oscillator means and to said phase comparator means for selecting a specific frequency component of said oscillation output to provide said comparison signal, the selecting operation of said signal selection means being synchronized with the sequential changing of the address designation by said change means, said signal selection means further comprising heterodyne means coupled to said voltage controlled oscillator means and to said phase comprator means and being responsive to an input signal for detecting the frequency difference between said input signal and said oscillation output and providing said comparison signal whose frequency is equal to said frequency difference.

9. A variable frequency oscillator according to claim 8, further comprising:

extractor means coupled to said voltage controlled oscillator means, for extracting a specific frequency component from said oscillation output and providing an interference signal having said specific frequency component; and mixer means coupled to said extractor means and being responsive to said input signal, for mixing said interference signal with said input signal to provide an output signal which contains information of said input signal except for information of the frequency of said interference signal.

* * * * *